US006489246B1

(12) United States Patent
Summa et al.

(10) Patent No.: US 6,489,246 B1
(45) Date of Patent: Dec. 3, 2002

(54) METHOD FOR MANUFACTURING CHARGE-COUPLED IMAGE SENSORS

(75) Inventors: Joseph R. Summa, Hilton, NY (US); David L. Losee, Fairport, NY (US); Eric J. Knappenberger, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/846,854

(22) Filed: May 1, 2001

(51) Int. Cl.[7] ............................................. H01L 21/302
(52) U.S. Cl. ........................ 438/710; 438/719; 438/720; 438/722; 438/723; 438/724; 438/725
(58) Field of Search ................................. 438/710, 719, 438/720, 722, 723, 724, 725, 742

(56) References Cited

U.S. PATENT DOCUMENTS 4,604,519 A * 8/1986 Zollman et al. ...... 250/213 VT
4,613,402 A    9/1986 Losee et al. ................. 156/643
5,240,873 A * 8/1993 Shinji ......................... 438/144
5,654,202 A * 8/1997 Daly et al. .................... 438/70
5,891,752 A * 4/1999 Losee ........................... 438/75

* cited by examiner

Primary Examiner—Benjamin L. Utech
Assistant Examiner—Binh X. Tran
(74) Attorney, Agent, or Firm—Peyton C. Watkins

(57) ABSTRACT

A method of manufacturing an image sensor, the method comprises the steps providing a substrate having a gate insulating layer abutting a portion of the substrate; depositing a silicon layer on the gate insulating layer; creating a plurality of openings in the deposited silicon layer for forming a plurality of etched deposited silicon; growing an oxide on first surfaces of the etched deposited silicon which first surfaces initially form a boundary for the openings; coating photoresist in the plurality of openings between the first surfaces of the oxidized silicon; and exposing the photoresist for removing the photoresist which overlies the silicon and retains a portion of the photoresist in the openings and on the first surface of the oxidized silicon.

10 Claims, 9 Drawing Sheets

METHOD FOR MANUFACTURING CHARGE-COUPLED IMAGE SENSORS

FIELD OF THE INVENTION

The present invention is related to charge-coupled image sensors and, more particularly, to a method for manufacturing such charge-coupled devices.

BACKGROUND OF THE INVENTION

Solid state charge coupled image sensing devices (CCDs) are generally classified into two types: interline transfer type or frame transfer type. The CCD array is typically composed of an array of closely spaced gates composed of polycrystalline silicon (polysilicon). Polysilicon has been a preferred material due to the ease with which a reliable thin insulating layer may be produced for insulating the separate gates from one another. In operation of frame transfer type imagers, incident light must pass through the gate electrodes and be absorbed by the underlying silicon. Thus, it is desired that these gates be transparent to a broad spectrum of wavelengths of light, and in particular to be transparent to shorter wavelengths, for example, shorter than 450 nm wavelength. Polysilicon gates are not suitable for efficient transmission of light in this wavelength range. Hence, devices utilizing more transparent conducting materials, typically composed of conducting oxide materials such as indium-tin-oxide (ITO), have been proposed. As used herein, the term ITO is to be understood to include other conducting oxide materials of other compositions as well.

U.S. Pat. No. 5,891,752 by Losee discloses a method for constructing a CCD image sensor with all ITO gates. In that device, however, the ITO gates are subjected to chemical mechanical polishing (CMP) to achieve the required electrical isolation between adjacent gates. This CMP process is inherently no-uniform over widely spaced regions and, hence, devices so produced have some variation in ITO thickness from one area of the device to another. Due to the relatively high index of refraction of the ITO material, this thickness variation results in variation in the relative amount of light which reaches the silicon substrate, and therefore, produces a spatial variation in the relative sensitivity of the device. For improved optical response, it is desirable to employ relatively thin ITO for the gates, for example, using thicknesses less than 100 nm. With decreasing ITO gate thickness, the variation in thickness caused by the CMP process causes stronger variation in the relative sensitivity of the device.

Another concern with the polished structure, particularly when thin ITO gates are desired, is due to fixed electrostatic charges which inevitably occur in overlying insulating layers of the device. Such fixed charge will cause small potential variations, usually as regions of increased electrostatic potential, immediately below the insulating gap between the CCD electrodes.

Although the presently known and utilized image sensors are satisfactory, they include the above-described drawbacks. Therefore, a need exists for uniform gate thickness in frame transfer CCD images sensors with all gates composed of ITO. A need also exists for reducing the effect of fixed charges which may be present in overlaying insulating layers. Such fixed charges can result in undesirable potential wells or barriers in the underlying silicon substrate, which, in turn, can lead to charge transfer inefficiency.

The present invention includes an image sensor for overcoming these shortcomings.

SUMMARY OF THE INVENTION

The present invention is directed to overcoming one or more of the problems set forth above. Briefly summarized, according to one aspect of the present invention, the invention resides a method of manufacturing an image sensor, the method comprising the steps providing a substrate having a gate insulating layer abutting a portion of the substrate; depositing a silicon layer on the gate insulating layer; creating a plurality of openings in the deposited silicon layer for forming a plurality of etched deposited silicon; growing an oxide on first surfaces of the etched deposited silicon which first surfaces initially form a boundary for the openings; coating photoresist in the plurality of openings between the first surfaces of the oxidized silicon; and exposing the photoresist for removing the photoresist which overlies the silicon and retains a portion of the photoresist in the openings and on the first surface of the oxidized silicon.

The above and other objects of the present invention will become more apparent when taken in conjunction with the following description and drawings wherein identical reference numerals have been used, where possible, to designate identical elements that are common to the figures.

ADVANTAGES OF THE PRESENT INVENTION

The present invention includes the advantage of an image sensor having gate electrodes which are substantially U-shaped, which effectively shields the charge transfer channel from the effects of the fixed charge and wherein the gate electrode material, for example, ITO, is of improved optical uniformity. Finally, the present invention provides a means of precision placement of dopants with respect to the edges of the CCD gates. The advantages of such precision placement of dopants has been discussed in U.S. Pat. No. 4,613,402 by Losee et al.

DETAILED DESCRIPTION OF THE INVENTION

Figure 1A:
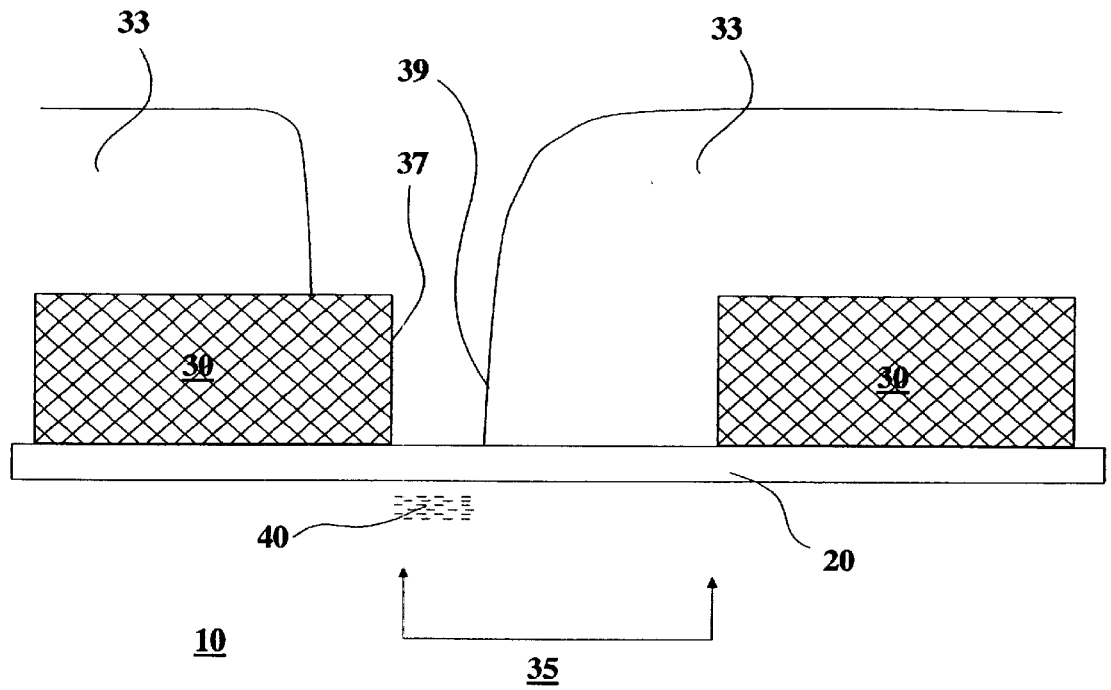
FIGS. 1a–1g are schematic cross-sectional views illustrating the present invention.

Referring to FIG. 1a, the initial stages of fabricating a CCD with U-shaped gates is illustrated. A silicon substrate 10 is provided with doped regions and insulating regions in such a way that an array of separated photosensitive sites, or pixels, is defined, typically arranged by rows and columns of pixels. The substrate 10 is provided with an insulating layer 20, hereinafter referred to as a gate insulator, and a layer of silicon, 30, hereinafter referred to as deposited silicon, which is deposited on the insulating layer 20. The deposited silicon 30 is etched to form a pattern of openings 35 in the deposited layer.

Photoresist 33 is deposited and positioned in a predetermined pattern and a suitable dopant is implanted into the substrate, which is masked on one side by the edge 37 of the deposited silicon 30 and on the other by the edge 39 of the photoresist 33. It is instructive to note that such a procedure places the dopant region 40 in a precise spatial relationship to the edge 37 of the deposited silicon 30. The photoresist 33 is then removed, i.e. subsequent to the dopant implantation.

Figure 1B:
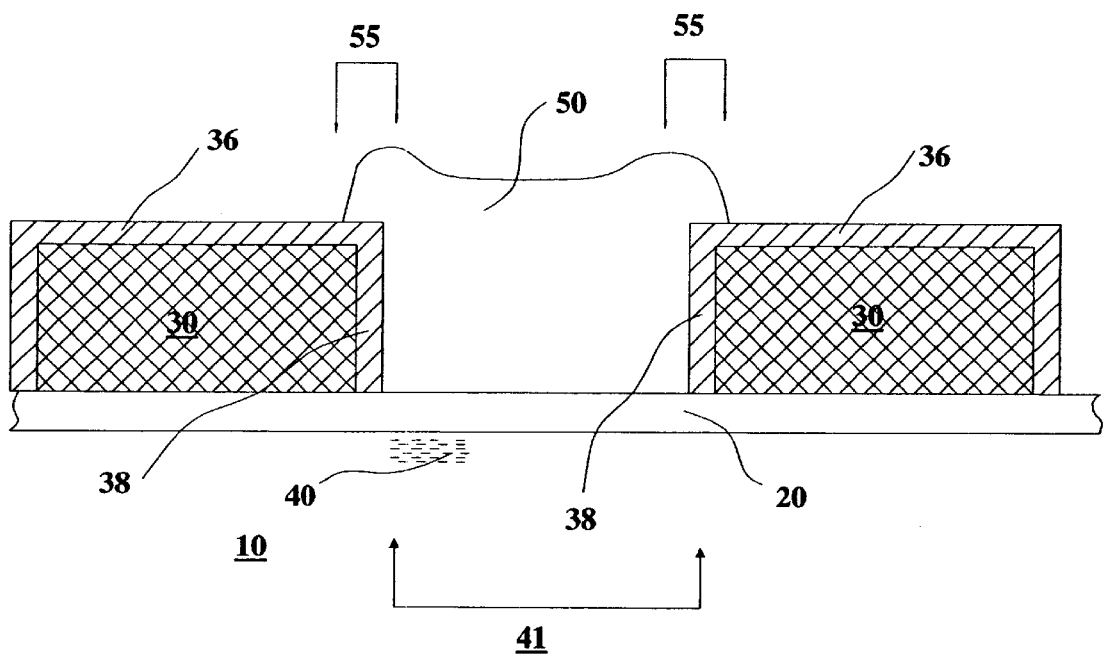

Referring to FIG. 1b, the deposited silicon layer 30 is oxidized to form a silicon dioxide coatings 36 and 38 on the top portions and side portions respectively, of the remaining deposited silicon 30. The oxide on the side portions 38 will be referred to hereinafter as sidewall oxide 38. Then, a new layer of photoresist 50 is applied and patterned, by photomasking and exposure to actinic radiation (both well known in the art), so as to fill the spaces 41 between the segments of oxide 38. In order to allow for inaccuracies in alignment for the exposure of this photoresist 50, there are typically overlap portions 55 where this photoresist layer 50 was resting over a portion of the remaining deposited silicon 30 and its oxidized sides 38.

Figure 1C:
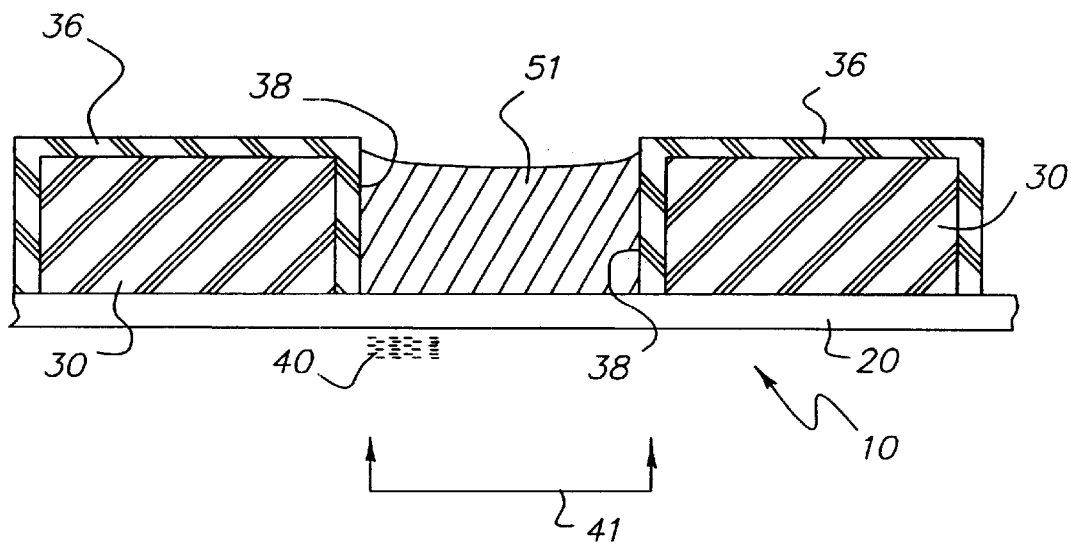

Referring to FIG. 1c, the layer photoresist pattern 50 is now subjected to an oxygen plasma treatment which partially removes material from the resist pattern which, in turn, leaves residual resist 51 in the spaces 41 between the oxidized deposited silicon 30 and sidewall oxides 38.

Figure 1D:
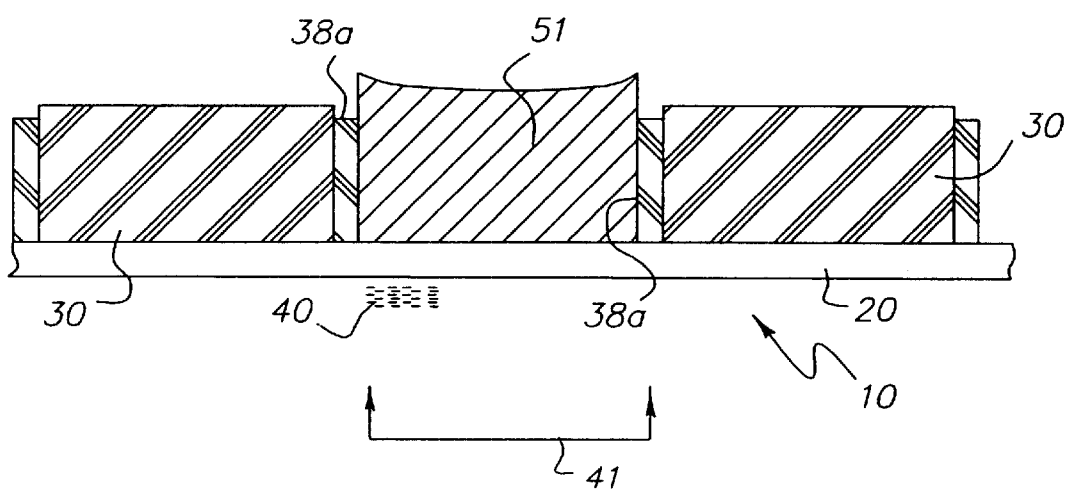

Referring to FIG. 1d, the oxide 36 on the top surfaces of the deposited silicon are removed by etching. In addition, a portion of the sidewall oxide 38 has been etched to slightly shorten the sidewall oxide 38 but leaving a major portion of the sidewall oxide 38a in place.

Figure 1E:
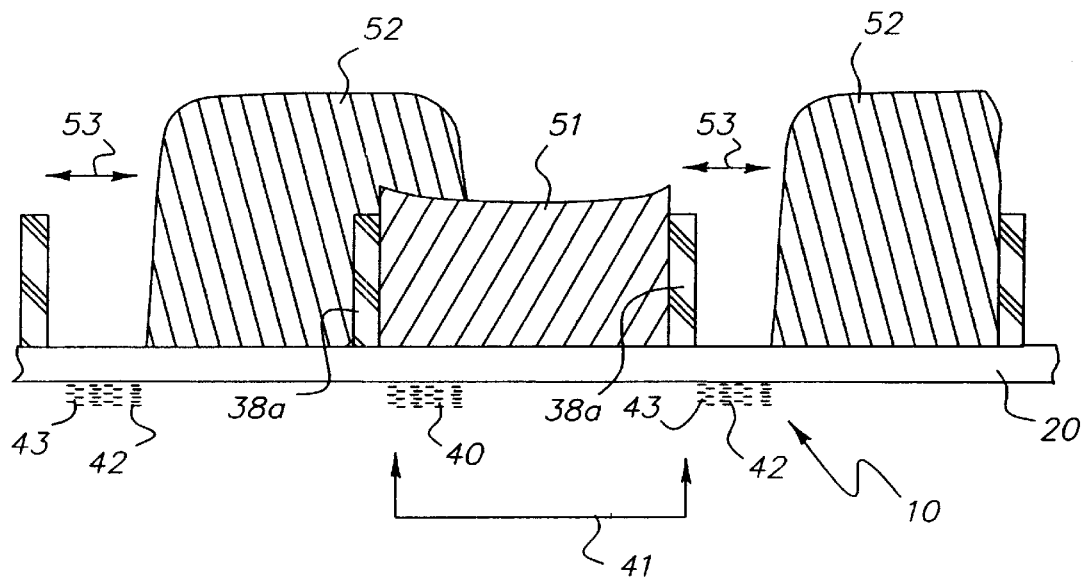

Referring to FIG. 1e, the deposited silicon 30 is removed but the residual first-layer resist 51 remains. Then a second layer of photoresist 52 is coated, exposed and developed such that a region 53 of gate insulator 20 adjacent to sidewall oxide 38a is exposed. Additional impurities 42 are implanted into the silicon substrate at this time by well known means. It is instructive to note that the presence of the sidewall oxide 38a and the residual resist 51 block the implantation, thus providing a precise location for the edge 43 of the implanted impurities with respect to the sidewall oxide 38a.

Figure 1F:
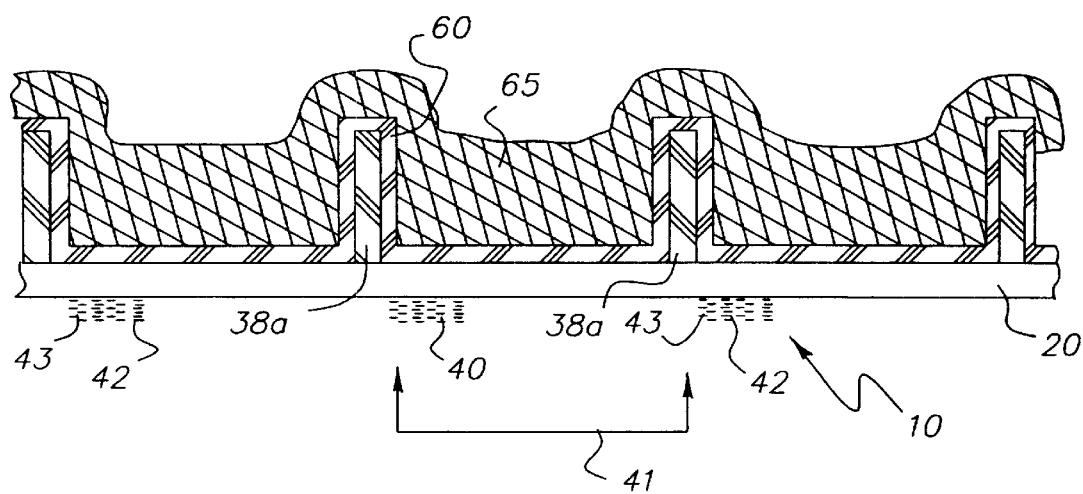

All photoresist is then removed by conventional means. Then, as shown in FIG. 1f, ITO layer 60 is deposited. This is followed by deposition of a buffer layer 65.

Figure 1G:
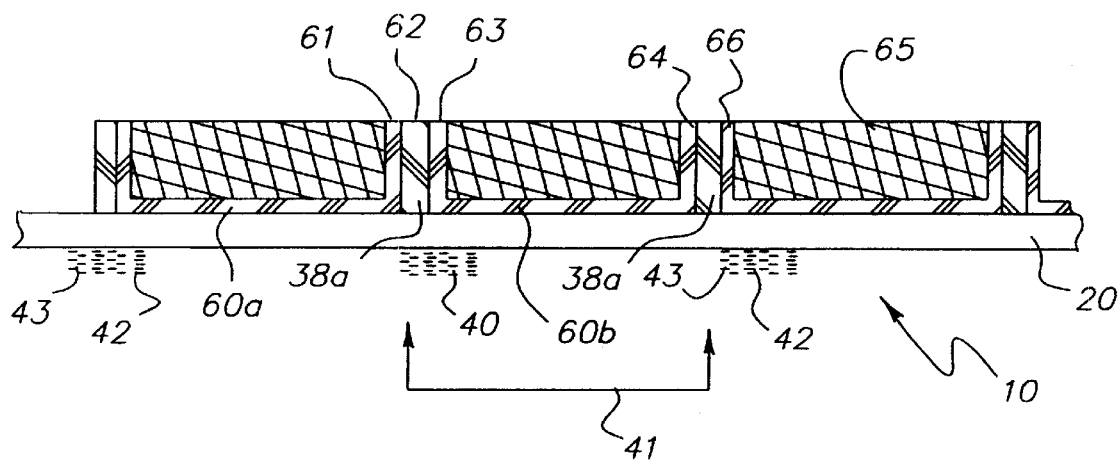

Finally, the structure of FIG. 1f is planarized by chemical mechanical polishing (CMP) such that the polish removes the deposited materials, 60 and 65 from the tops of the remaining sidewall oxide 38a. This is illustrated in FIG. 1g. It is also instructive to note that sidewall oxide 38a separates layer 60 into separate gates 60a and 60b.

As an additional feature, the CMP has also created substantially planar top surfaces 61 through 66. It will be obvious to those skilled in the art that additional components will be added to have a complete image sensor device.

Figure 2A:
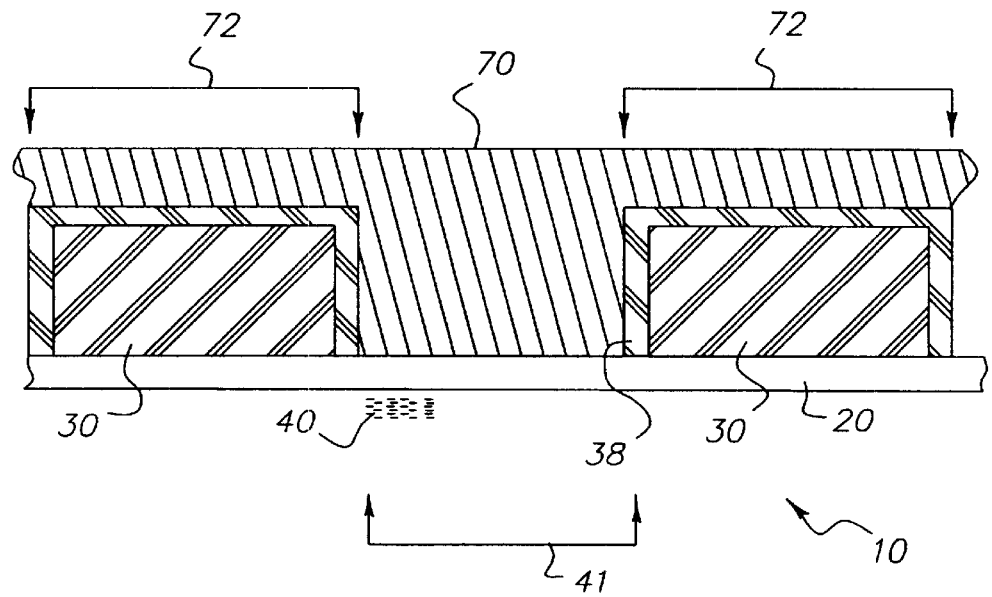
FIGS. 2a–2b are schematic cross-sectional views illustrating alternative embodiments.
Figure 2B:
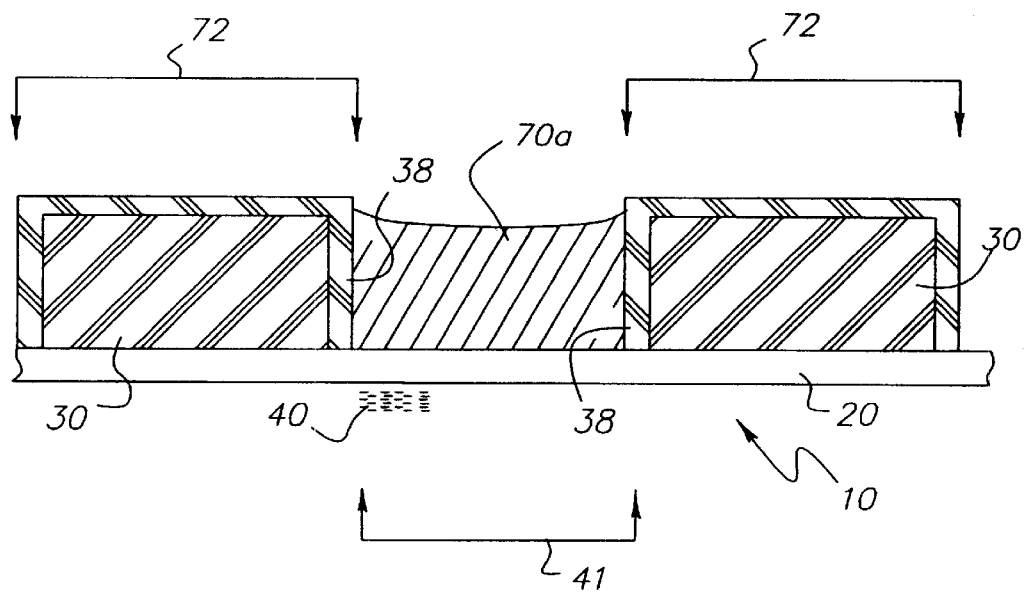

An alternative embodiment to the method illustrated in FIG. 1a through FIG. 1g is illustrated in FIGS. 2a–2b. There, the structure illustrated in FIG. 1b, without the resist 50, is coated with resist 70 such that the resist in regions 72 over the oxidized silicon layer 38 are covered with resist which is thinner than the resist in regions 41 between the patterned and oxidized silicon layers 30. This is illustrated in FIG. 2a. This structure is then exposed to an oxygen plasma such that the resist in regions 72 is removed but resist remains in regions 41. The resulting resist 70a is again as illustrated in FIG. 1c. Subsequent processing follows as previously described and illustrated in FIG. 1c through FIG. 1g.

Figure 3A:
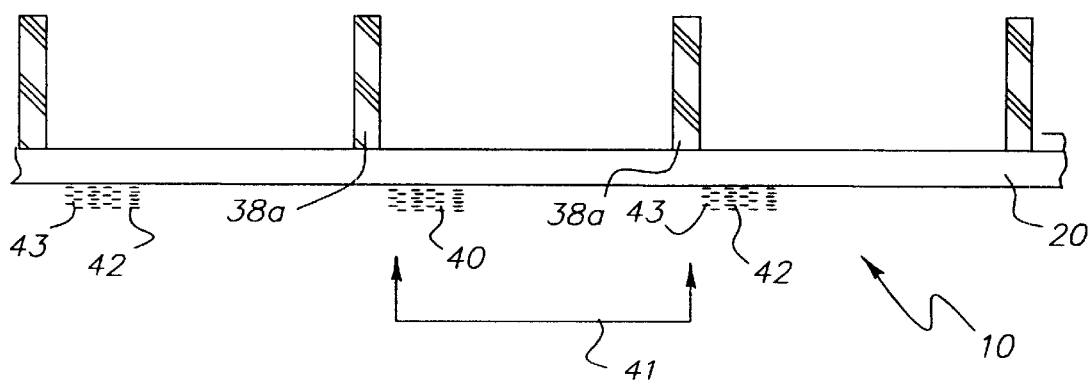
FIGS. 3a–3d are schematic cross-sectional views illustrating alternative embodiments.
Figure 3B:
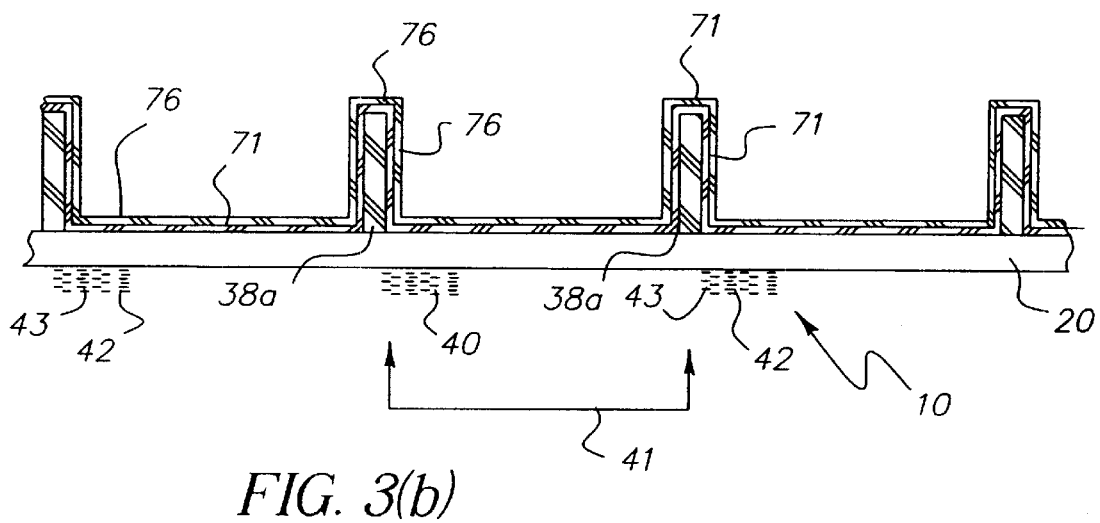
Figure 3C:
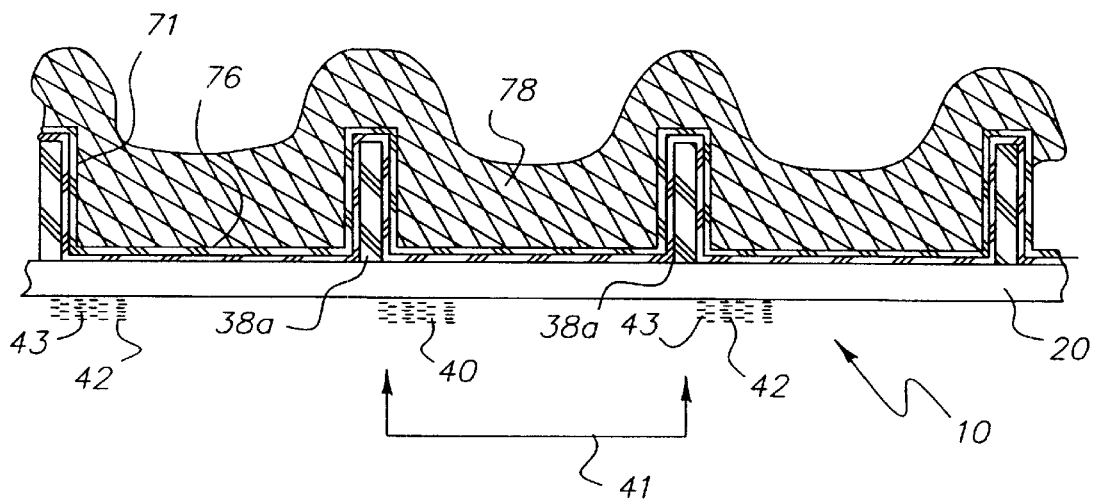
Figure 3D:
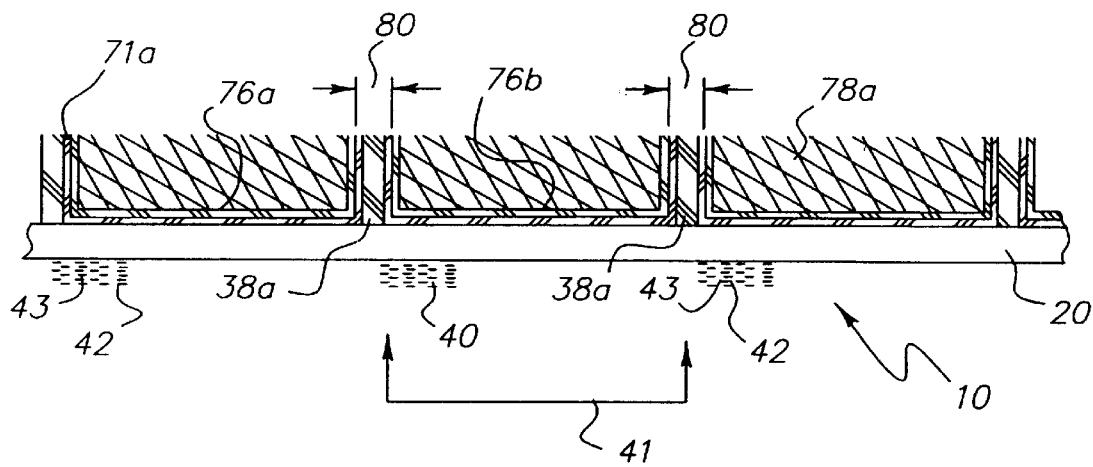

Another alternative embodiment to the method illustrated in FIG. 1a through FIG. 1g is illustrated in FIGS. 3a–3d. A structure is provided according to the methods described above following the steps illustrated in FIG. 1a through FIG. 1e. Continuing the process accordingly, in FIG. 3a, the photoresist is removed. Then, as illustrated in FIG. 3b, an additional insulator layer 71 and ITO layer 76 are deposited on all surfaces of the structure. As shown in FIG. 3c, a buffer layer 78 is deposited. Finally, layer 78 and portions of layers 71 and 76 are subjected to chemical mechanical polishing so as to remove these materials from the tops of the remaining sidewall oxide structures 38a. This results in the structure shown in FIG. 3d, where the remainder of layers 76, now indicated as 76a and 76b in the figure, are separated, in regions 80 by the remainder of the insulator 71 now shown as 71a, as well as the remaining sidewall oxide 38a The remainder of buffer layer 78 is indicated by 78a in this figure. A configuration such as this serves to provide additional insulation between the gates of the CCD.

Figure 4A:
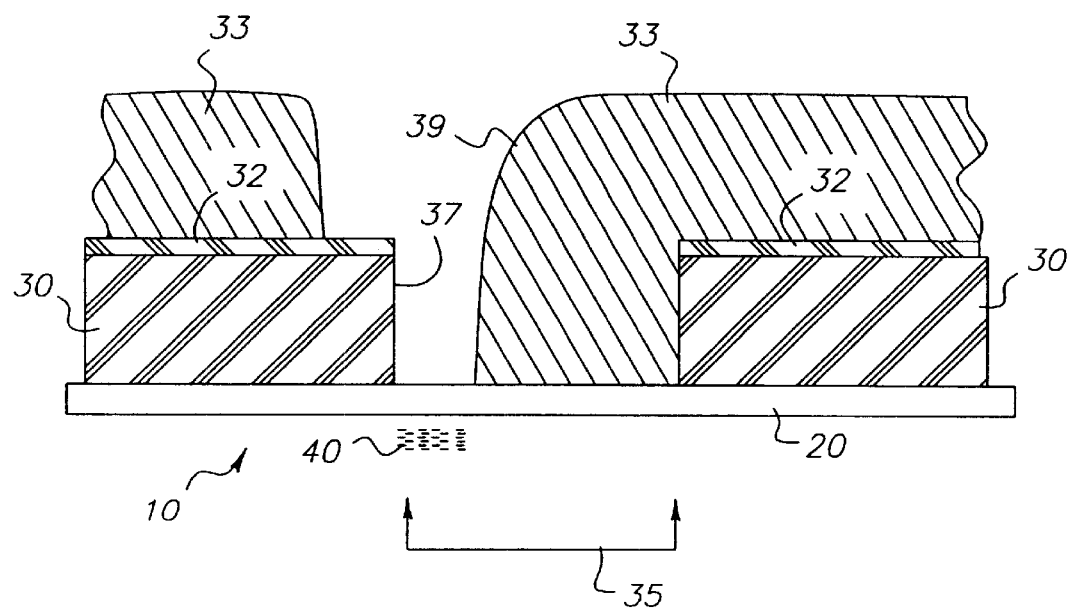
FIG. 4a–4d are schematic cross-sectional views illustrating alternative embodiments.
Figure 4B:
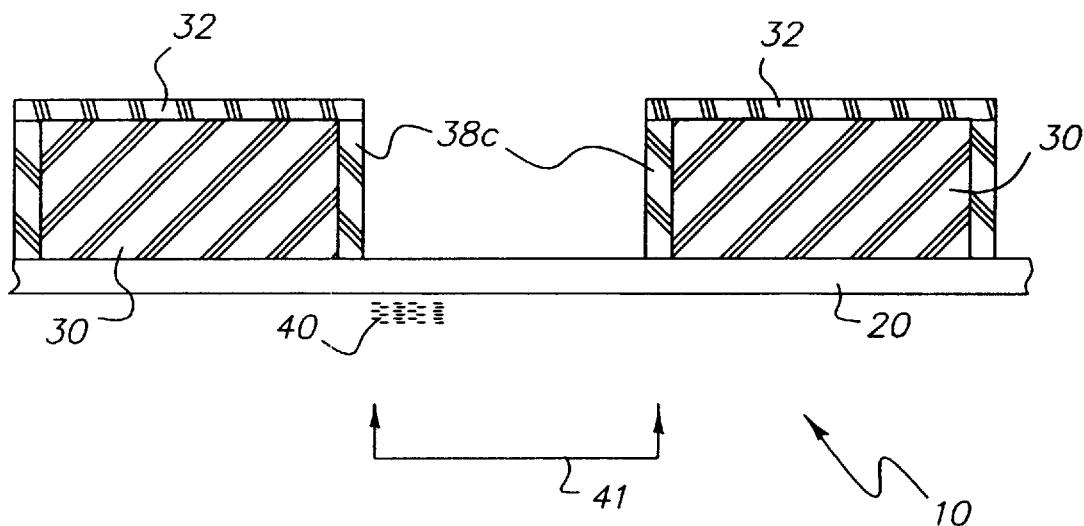
Figure 4C:
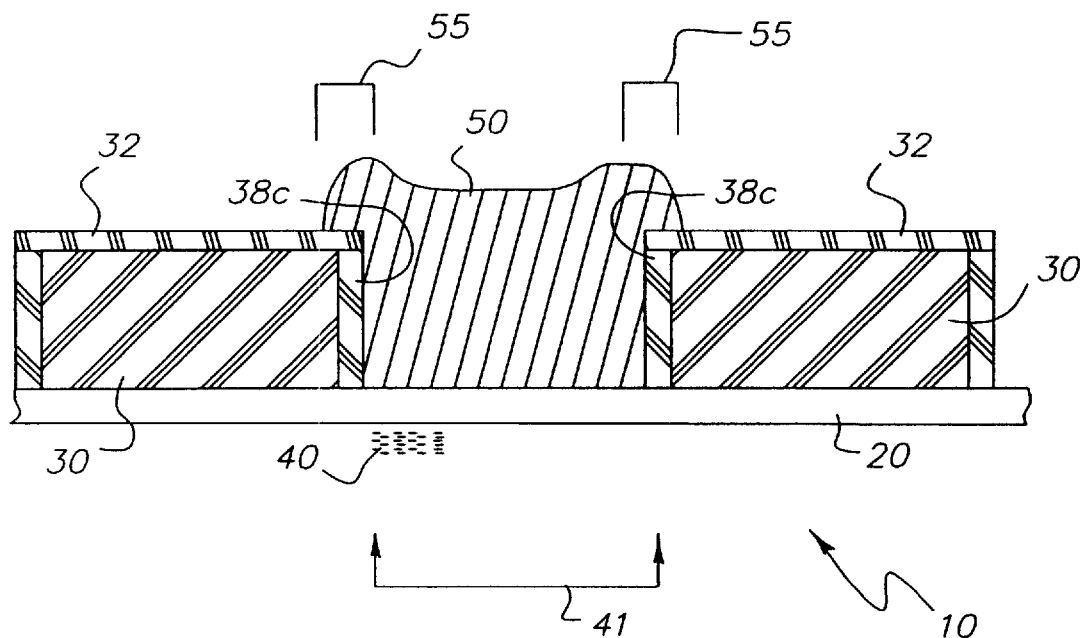

Another alternative embodiment to the method illustrated in FIG. 1a through FIG. 1g is illustrated in FIGS. 4a–4d. In this embodiment, a layer of silicon nitride 32 is deposited on the polysilicon layer 30 and etched an additionally layer 30 is etched to create spaces 35. Subsequent to etching, the structure is oxidized to create sidewall oxide layers 38c. Referring to FIG. 4b, the deposited silicon layer 30 and overlying silicon nitride 32 is oxidized to form a silicon dioxide coating 38c on the side portions of the remaining deposited silicon 30. The oxide on the side portions 38 will be referred to hereinafter as sidewall oxide 38c and the spaces between sidewall oxides 38c will be referred to as region 41. Then, a new layer of photoresist 50 is applied and patterned, by photomasking and exposure to actinic radiation (both well known in the art), so as to fill the spaces 41 between the segments of deposited silicon 30 and sidewall oxide 38c. In order to allow for inaccuracies in alignment for the exposure of this photoresist 50, there are typically overlap portions 55 where this photoresist layer 50 was resting over a portion of the remaining deposited silicon 30 and silicon nitride 32 and its oxidized sides 38c. This is shown in FIG. 4c.

Figure 4D:
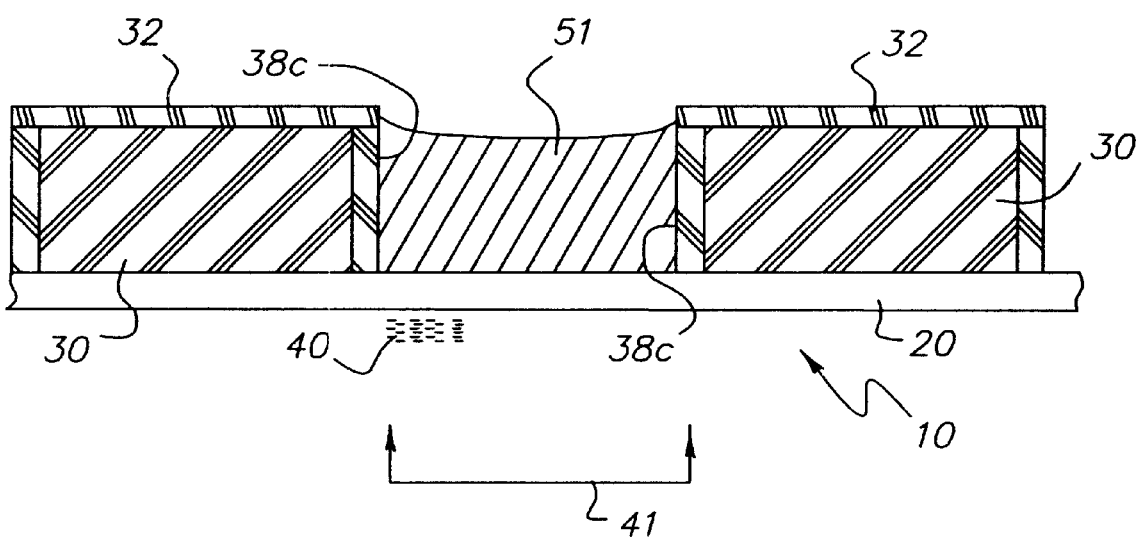

Referring to FIG. 4d, the layer photoresist pattern 50 is now subjected to an oxygen plasma treatment which partially removes material from the resist pattern which, in turn, leaves residual resist 51 in the spaces 41 between the oxidized sidewalls 38c. The silicon nitride is then removed and the subsequent steps are as in FIGS. 1d–1g.

The invention has been described in detail with particular reference to certain preferred embodiments thereof, but it will be understood that variations and modifications can be effected within the spirit and scope of the invention.

PARTS LIST 10 silicon substrate
20 insulating layer (gate insulator)
30 layer of silicon (deposited silicon)
32 silicon nitride
33 photoresist
35 pattern of openings (spaces)
36 silicon dioxide coating
37 edge
38 silicon dioxide coating (sidewall oxide)
38a major portion of the sidewall oxide
38c sidewall oxide layers (sidewall)
39 edge
40 dopant region
41 spaces (regions)
42 impurities
43 edge of the implanted impurities
50 photoresist
51 residual resist 52 second layer of photoresist
53 region of gate insulator 20
55 overlap portions
60 ITO layer
60a separate gate
60b separate gate
61 planar top surfaces
62 planar top surfaces
63 planar top surfaces
64 planar top surfaces
65 planar top surfaces (buffer layer)
66 planar top surfaces
70 resist
70a resulting resist
71 insulator layer
71a remainder of the insulator 71
72 regions
76 ITO layer
76a remainder of layers 76
76b remainder of layers 76
78 buffer layer
78a remainder of buffer layer 78
80 regions

What is claimed is:

1. A method of manufacturing an image sensor, the method comprising the steps:

(a) providing a substrate having a gate-insulating layer abutting a portion of the substrate;

(b) depositing a silicon layer on the gate-insulating layer, (c) creating a plurality of openings in the deposited silicon layer;

(d) implanting a first dopant in the substrate through at least one of the plurality of the openings;

(e) growing an oxide on first surfaces of the deposited silicon which first surfaces initially form a boundary for the openings;

(f) coating a first photoresist in the plurality of openings between the first surfaces of the oxidized silicon;

(g) exposing and developing the first photoresist for removing the first photoresist which overlies the silicon and retaining a portion of the first photoresist in the openings and on the first surface of the oxidized silicon;

(h) removing the deposited silicon by etching which does not substantially remove the first photoresist and patterning a layer of second photoresist while retaining the first photoresist; and (i) implanting a second dopant in the substrate through the patterned second photoresist to provide an implant substantially aligned to an edge of a sidewall of the grown oxide.

2. The method as in claim 1 further comprising the step of (g) growing an oxide on second surfaces each extending from the first surfaces of the etched deposited silicon.

3. The method as in claim 1, wherein step (e) further includes exposing the photoresist to an oxidizing plasma.

4. The method as in claim 1, wherein step (e) includes exposing the photoresist to actinic radiation.

5. The method as in claim 1 wherein the step (b) includes providing silicon nitride over the deposited silicon.

6. The method as in claim 1 further comprising the step of removing the second surface of oxidized silicon and retaining a first surface portion of oxidized silicon.

7. The method as in claim 6 comprising the step of removing the first photoresist and the second photoresist.

8. The method as in claim 7 further comprising the step of depositing a coating of a substantially transparent conducting material of thickness less than the thickness of the deposited silicon coating in at least one of the plurality of openings and on the remaining portion of the first surface of oxidized silicon.

9. The method as in claim 8 further comprising the step of depositing a buffer layer on the transparent conducting material.

10. The method as in claim 9 further comprising the step of planarizing the buffer layer, first surface portion of oxidized silicon and conducting material by chemical polishing so as to remove the buffer layer and the conductive oxide from a surface of the first surface portion of oxidized silicon.

* * * * *